United States Patent [19]
Bose et al.
[11] 3,772,675
[45] Nov. 13, 1973

[54] MAGNETIC ANALOG-TO-DIGITAL ENCODER

[75] Inventors: Norman J. Bose, North Hollywood; Hamid H. Sani, Glendale, both of Calif.

[73] Assignee: The Singer Company, New York, N.Y.

[22] Filed: May 15, 1972

[21] Appl. No.: 253,636

[52] U.S. Cl. .......... 340/347 P
[51] Int. Cl. .......... H03k 13/02
[58] Field of Search .......... 340/347

[56] References Cited

UNITED STATES PATENTS

| | | | |
|---|---|---|---|
| 3,478,346 | 11/1969 | Narukiyo | 340/347 P |
| 3,466,646 | 9/1969 | Lewin | 340/347 P |
| 3,525,094 | 8/1970 | Leonard | 340/347 P |
| 3,504,359 | 3/1970 | Hawksworth | 340/347 P |
| 3,509,555 | 4/1970 | Loughlin | 340/347 P |
| 3,171,104 | 2/1965 | Norton | 340/347 P |
| 3,540,036 | 11/1970 | Packard | 340/347 P |
| 3,513,469 | 5/1970 | Christensen | 340/347 P |

*Primary Examiner*—Maynard R. Wilbur
*Assistant Examiner*—Jeremiah Glassman
*Attorney*—Linval B. Castle

[57] ABSTRACT

A magnetic shaft rotation-to-digital encoder is provided which includes magnetic sensors positioned adjacent to a high speed and a low speed magnetically coded rotatable disc, the sensors being wound with two excitation windings and an output winding, and being wired for coincident current operation in an X-Y matrix form. When X and Y signals coincide in a particular sensor core, the core is set to a logic "1," unless the sensor senses an inhibiting magnetic field on its associated disc. Each of the two rotatable discs has four binary coded magnetic tracks on its surface in the embodiment to be described. By positioning five magnetic sensors on the least significant digit track of the high speed disc, a total of eight tracks provide output signals which, when applied to appropriate logic circuitry, produce 11 output binary bits in any desired code, such as the ICAO altitude code which is in general use in conjunction with aircraft transponders.

7 Claims, 9 Drawing Figures

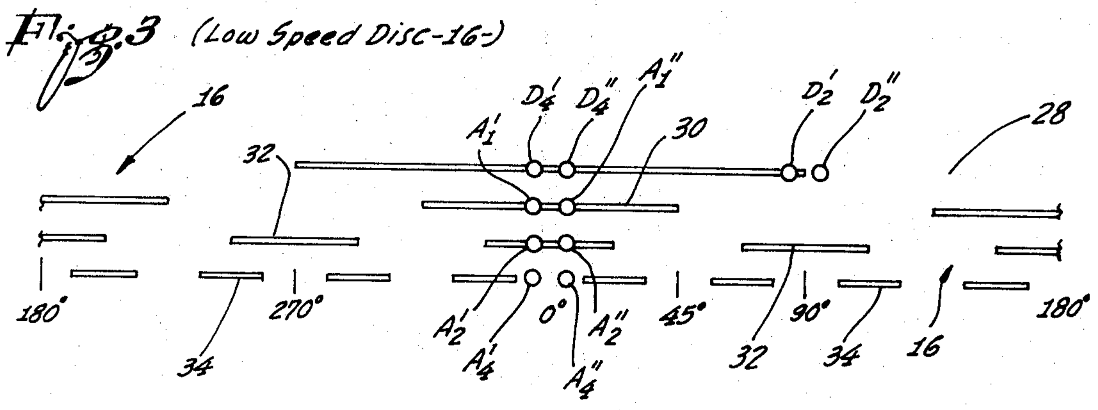
FIG. 3 (Low Speed Disc-16-)
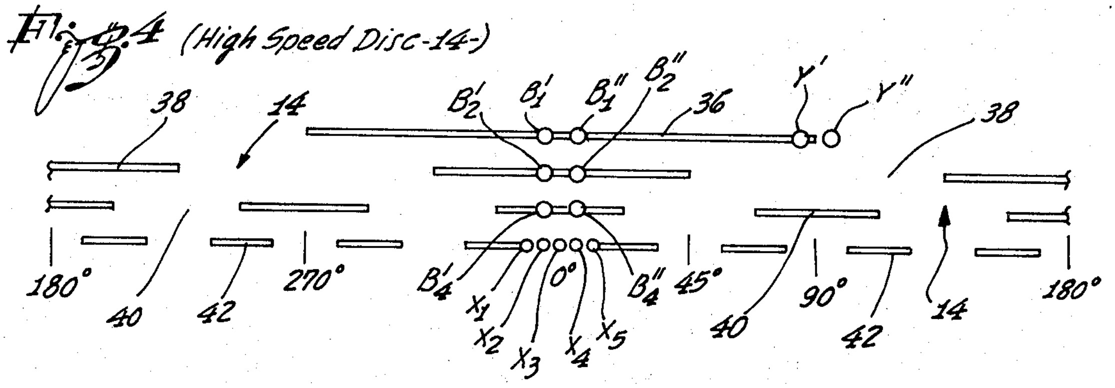
FIG. 4 (High Speed Disc-14-)
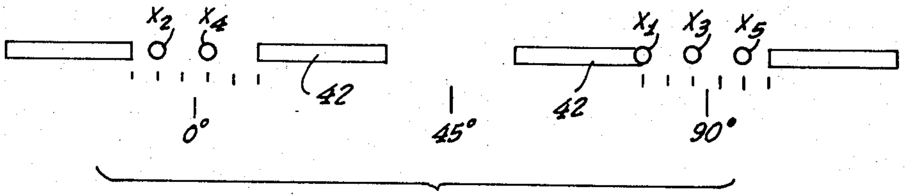
FIG. 5

MAGNETIC ANALOG-TO-DIGITAL ENCODER

The invention described herein was made in the course of a contract with the Department of the Navy.

BACKGROUND OF THE INVENTION

Analog shaft rotation-to-digital encoders fall into three basic categories, namely, the brush-contact encoder, the optical encoder and the magnetic encoder.

The brush-contact encoder, which employs a conductive brush for each of a plurality of concentric tracks on a rotatable disc containing a plurality of binary encoded conductive commutator segments, is generally the least complicated encoder and is capable of high resolution in a very small size. However, the useful life of a brush-contact encoder is relatively short inasmush as brush wear and commutator pitting will eventually occur to produce output "noise" which renders the encoder incapable of accurate read-out.

The optical encoder is generally provided with a rotatable input disc containing a plurality of tracks of binary coded apertures through which a light beam is projected, the beam being focused upon a photoelectric sensor. Optical encoders generally are incapable of high resolution, but they have an extremely long life if used in an environment which is not detrimental to the delicate light source and sensitive photoelectric sensors which are used in such an envoder.

The magnetic encoder, also being a non-contact device, may have a very long life. The magnetic encoder has certain advantages over the optical encoder, particularly in that it is generally much less susceptible than the optical encoder to damage by vibration and shock.

An important object of the present invention is to provide an improved, rugged and reliable shaft position-to-digital magnetic encoder which may be made physically small, and yet which may have at least an 11 binary bit output for use as an ICAO coded altitude reporting encoder in aircraft transponding equipment. Since magnetic encoders have long life as well as being rugged and reliable, it is apparent that this type of encoder should be ideal for such a use. However, because of cross-talk in closely spaced magnetic tracks on a disc, it is most difficult to obtain 11 output bits from, for example, a small sized magnetic encoder, although this has been achieved in the prior art. However, the prior art devices employ three separate code discs, and a complicated gear-coupling arrangement, or a complex magnetic flux coupling system such as described in Bose U.S. Pat. No. 3,453,614.

The magnetic encoder of the present invention, unlike the prior art magnetic encoders of the same general size and capabilities, is mechanically simple. Moreover, it is easily manufactured in the small standard size 11 units (1.1 inches in diameter). The encoder of the invention includes a first high speed magnetic disc which is gear-coupled to a second low speed magnetic disc. Eleven output binary bits are obtained from the magnetic encoder of the invention, in the embodiment to be described, with only four binary coded tracks on each of the two discs. While the output from the encoder may be in any desired digital code without any mechanical change being required, the simplicity and ruggedness of the unit of the invention makes it particularly suitable for the aforementioned ICAO altitude reporting encoder application.

As mentioned above, each of the two discs of the magnetic encoder of the invention contains four concentric magnetic code tracks. Two magnetic sensors, spaced for well-known U-scan read-out, are positioned adjacent each of the tracks, except for the least significant digit track of the high speed disc. That track is read by five magnetic sensors which are effectively equally spaced within one magnetic segment length.

Each of the magnetic sensors used in the encoder of the invention, as mentioned above, comprises a magnetic core, which is wound with two excitation windings, a reset winding, and an output sensing winding.

The sensors are wired in the encoder in an X-Y matrix form similar to that used in magnetic memories. When X and Y drive signals are simultaneously applied to a particular sensor, the magnetic field generated therein will switch the remnant state of its core to produce an output signal, unless the sensor senses an inhibiting magnetic field from a magnetic coded segment on its associated disc.

The output signals from all the sensors are applied to appropriate logic circuitry which includes a shift register and appropriate decoder circuits. The logic circuitry produces a binary output code corresponding to the particular position of the input shaft at the instant the X and Y drive currents are applied to the sensing core matrix.

Since the two rotatable discs of the encoder to be described each contain four code tracks, one would normally expect an eight-bit binary output to be generated. However, such is not the case. The output signals from the five magnetic sensors associated with the least significant digit track of the high speed disc are processed in the logic circuitry to produce the equivalent of three binary bits from that track alone. Furthermore, the most significant digit track on the low speed disc produces two binary bits so that the total of eight tracks on the two input discs produce eleven output bits.

BRIEF DESCRIPTION OF THE DRAWINGS

FIG. 3 is a linear developed representation of the magnetic field pattern and sensor positions on the low speed rotatable magnetic disc;

FIG. 4 is a linear developed representation of the magnetic field patterns and sensor positions on the high speed rotatable magnetic disc;

FIG. 5 is an expanded view of a portion of the least significant digit track in the representation of FIG. 4 and illustrates a preferred positioning of the sensors with respect to that track;

DETAILED DESCRIPTION OF THE ILLUSTRATED EMBODIMENT

Figure 1:
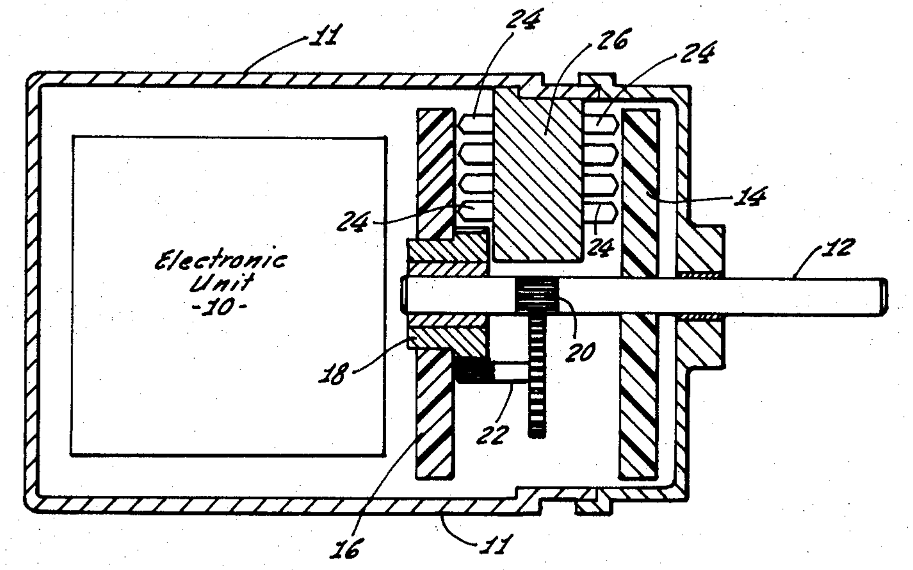
FIG. 1 is a simplified sectional drawing of one embodiment of the encoder of the invention illustrating the two rotatable magnetic discs included in the encoder, and the gearing coupling the high speed disc to the low speed disc.

A simplified cross-sectional view of one embodiment of the encoder 10 of the invention is illustrated in FIG. 1. The encoder is contained in a cylindrical housing 11, and it includes a rotatable input shaft 12 coaxial with the longitudinal axis of the housing 11, and supported in the housing by suitable bearings (not shown). A first, or high speed rotatable magnetic code disc 14 is keyed to the shaft 12 for rotation therewith. A second, or low speed rotatable magnetic code disc 16 is mounted on a geared hub 18. The hub, in turn, is mounted on the shaft 12 by suitable bearings (not shown) so as to be rotatable on the shaft. A pinion gear 20, formed in the shaft 12, is coupled to drive a 16:1 spur and pinion reduction gear assembly 22. The gear assembly 22 drives the geared hub 18 and the low speed disc 16 at a speed which is 1/16th that of the speed of the high speed disc 14.

Figure 2:
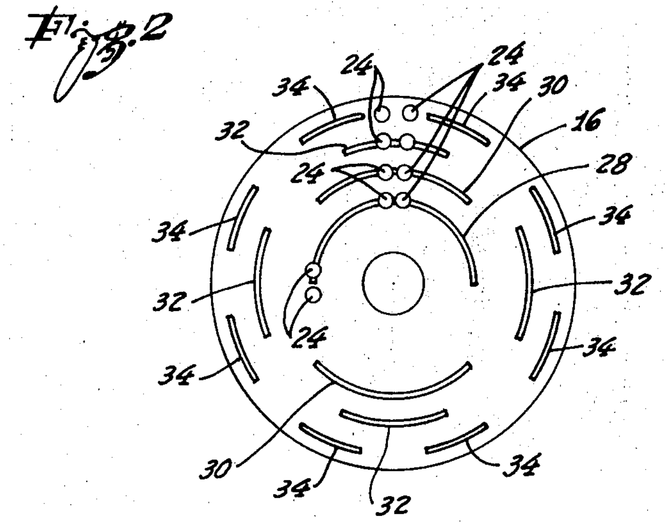
FIG. 2 is an illustration of the magnetic field pattern and sensor positions on one of the rotatable magnetic discs.

The rotatable magnetic code discs 14 and 16 contain identical binary codes in the form of magnetized segments in four coaxial tracks on a surface of each disc, as shown in FIG. 2. Accordingly, each code disc is composed of appropriate material capable of being spot magnetized. For example, barium ferrite, magnetized in accordance with the teachings of the aforementioned Bose U.S. Pat. No. 3,453,614 is a suitable material for the code discs 14 and 16.

The code discs 14 and 16 are mounted in the housing 11 with their coded surfaces facing one another so that a plurality of magnetic sensors 24 may be rigidly mounted between the two discs on a single mounting block 26. The mounting block 26, in turn, is rigidly mounted in the housing 11.

FIG. 2 illustrates schematically the magnetic binary code pattern which is formed on the low speed magnitude disc 16, and the positions of the magnetic sensors 24 with respect thereto. The disc 16 is permanently magnetized with four concentric tracks of varying length and digital significance. The inner, or most significant, digit track 28 is magnetized to produce a magnetic flux over an arcuate length of 180°. The magnetic field of the track 30 of next lower digital significance has a langth of 90°; the magnetic field of the third track 32 has an arcuate length of 45°; and the magnetic field of the outer, or least significant digit track 34 has a length of 22½°. It will be appreciated that there is one magnetic segment in the inner track 28, two magnetic segments in the track 30, four magnetic segments in the track 32, and eight magnetic segments in the outer track 34.

As shown in FIG. 2, there are two magnetic sensors 24 positioned over each of the concentric tracks on the low speed magnetic disc 16. These sensors are spaced for a standard U-scan read-out, and they are therefore spaced from one another by an amount equal to one-half the length of a segment in the least significant digit track 34. An additional pair of sensors 24 are shown on the most significant track 28, the latter sensors being positioned 90° from the other sensors in the track 28 to provide an additional output data bit, as will be subsequently described.

FIG. 3 is a linear representation of the magnetic field pattern and sensor positions on the low speed disc 16, and it is merely a linear developed expansion of the four concentric tracks described in conjuction with FIG. 2. FIG. 4, on the other hand, is a linear developed representation of the magnetic pattern and sensor positions on the high speed disc 14. As shown in FIG. 4 the positions of the sensors over the most significant track 36, and over the next two lower significant digit tracks 38 and 40, are identical with the sensor positions on the low speed disc 16 with respect to the tracks 28, 30 and 32, as shown in FIG. 3.

In FIG. 3 the magnetic sensors 24 have been designated in accordance with the standard designations adopted for the standard ICAO altitude code. Accordingly, a branch of leading sensors designated $A'_4$, $A'_2$, $A'_1$, $D'_4$ and $D'_2$ are respectively positioned to read the segments in the tracks 34, 32, 30 and 28. These sensors produce output signals which, when processed, conform to the corresponding designated binary bits of the ICAO code Positioned to read the same tracks in a branch of lagging sensors designated $A''_4$, $A''_2$, $A''_1$, $D''_4$ and $D''_2$, these latter sensors being spaced from the corresponding sensors of the leading brach by an amount equal to one-half the length of one segment in the least significant digit track 34 of the low speed disc 16.

FIG. 4 is a linear representation of the magnetic pattern and sensor positions on the high speed disc 14. As shown in FIG. 4, the positions of the sensors on the most significant digit track 36 and on the next two lower significant digit tracks 38 and 40 are identical with the positions of the sensors in the tracks 28, 30 and 32 on the low speed disc 16, as shown in FIG. 3. As in the case of FIG. 3, the sensors associated with tracks 36, 38 and 40 have been designated to correspond with the accepted designation of the standard ICAO cide. Accordingly, tracks 36, 38 and 40 are read by a leading branch of sensors $B'_1$, $B'_2$ and $B'_4$, and by a lagging branch of sensors $B''_1$, $B''_2$ and $B''_4$.

An additional pair of sensors Y' and Y'' are positioned on the most significant digit track 36, and are spaced from the sensors $B'_1$ and $B''_1$ by 90°. The outputs from the sensors Y' and Y'' are used to select the leading or the lagging branch of sensors associated with the low speed disc 16 in accordance with the well known U-scan technique. That is, the outputs from the sensors Y' and Y'' select a sensor from one of the two branches, either leading or lagging, to read the corresponding coded segment of its associated track, if a sensor in the other branch is near the boundary between a magnetic and a non-magnetic segment, so as to prevent the possibility of a read-out ambiguity.

Figure 6:
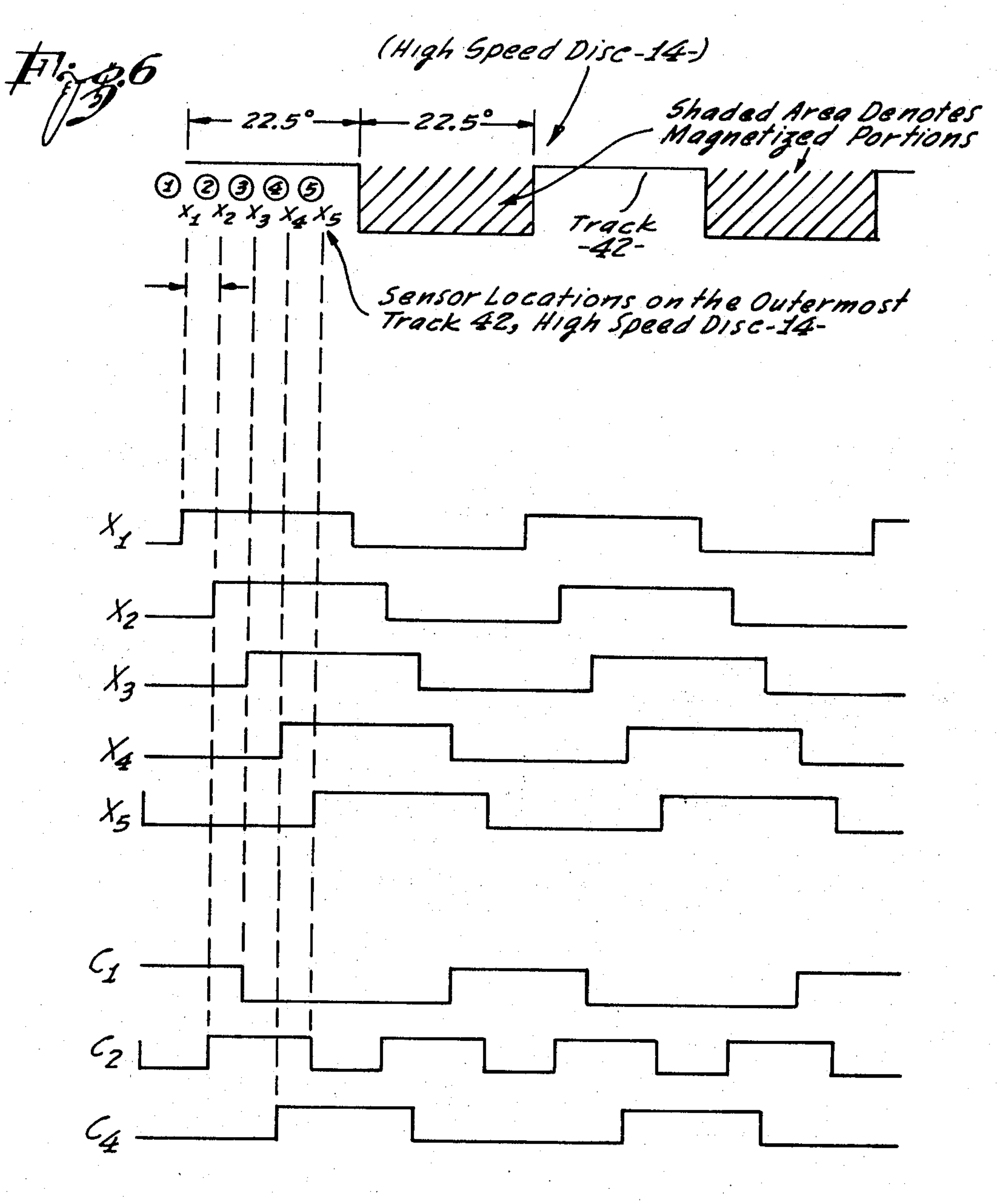
FIG. 6 is a waveform representation of the output of each sensor associated with the least significant digit track of FIG. 5.

The least significant track 42 of FIG. 4 is used to generate the binary bits C1, C2 and C4 in the ICAO code, as shown schematically in FIG. 6. In addition, the signals generated by the sensors X1, X2, X3, X4 and X5 associated with this track are processed to select either the leading or lagging branch of sensors associated with tracks 36, 38 and 40 in accordance with the well known U-scan techniques. As shown in FIG. 4, the sensors X1, X2, X3, X4 and X5 associated with the least significant digit track 42 are evenly spaced within one segment length in that track. In order to simplify the manufacture of the sensor assembly and to reduce the possibility of cross-talk between the adjacent sensors X1–X5, it is desirable to separate the five sensors in some configuration, such as illustrated in FIG. 5, which is an expanded view of a portion of the track 42 of FIG. 4. In FIG. 5, the sensors X2 and X4 are displaced along the track 42 by 90° from the sensors X1, X3 and X5.

The signals generated by the sensors X1–X5 are represented in the schematic diagram of FIG. 6. It will be seen that as the magnetic segments of track 42 are swept passed the sensors X1–X5, a series of waveforms designated X1–X5 in FIG. 6 are generated by the sensors, and these waveforms are subsequently processed, in a manner to be described to produce the binary output bits C1, C2 and C4 of the ICAO code, in accordance with the waveforms shown at the bottom of FIG. 6. Although the sensors in FIG. 6 are shown as positioned adjacent to one another, as in FIG. 4, the placement of the sensors in the positions shown in FIG. 5 will produce an identical series of waveforms X1–X5 as the series shown in FIG. 6.

As described briefly above, each sensor 24 comprises a very small ferromagnetic toroid core having a series of windings wound on it to constitute a small transformer. The transformer has a secondary, or output, winding; a pair of primary windings; and a reset winding. When a drive signal is applied to the two primary windings of the sensor, the core will switch its magnetic remnant state and will produce an output signal across the secondary winding, unless the core senses a magnetic segment on its associated track. The magnetic segments on the tracks produce magnetic fields which have a tendency to saturate the ferromagnetic sensor cores and to prevent the primary winding drive signals from inducing output signals in the secondary windings.

The mechanical section of the encoder, as shown in FIG. 1, has been constructed to have the shortest permissible width, in order to conserve as much space as possible in the encoder housing 11 for the electronic circuit package, which will now be described. The electronic circuit package is mounted within the housing 11 in the space shown in FIG. 1 to the left of the mechanical unit. As described, the mechanical unit includes thirteen sensors 24 associated with the high speed disc 14 and ten sensors 24 associated with the low speed disc. In the construction of the encoder unit, the sensors 24 are located in slots placed a precise angular distance with reference to one another and to the encoded magnetic pattern on the magnetically coded discs 14 and 16.

Figure 7:
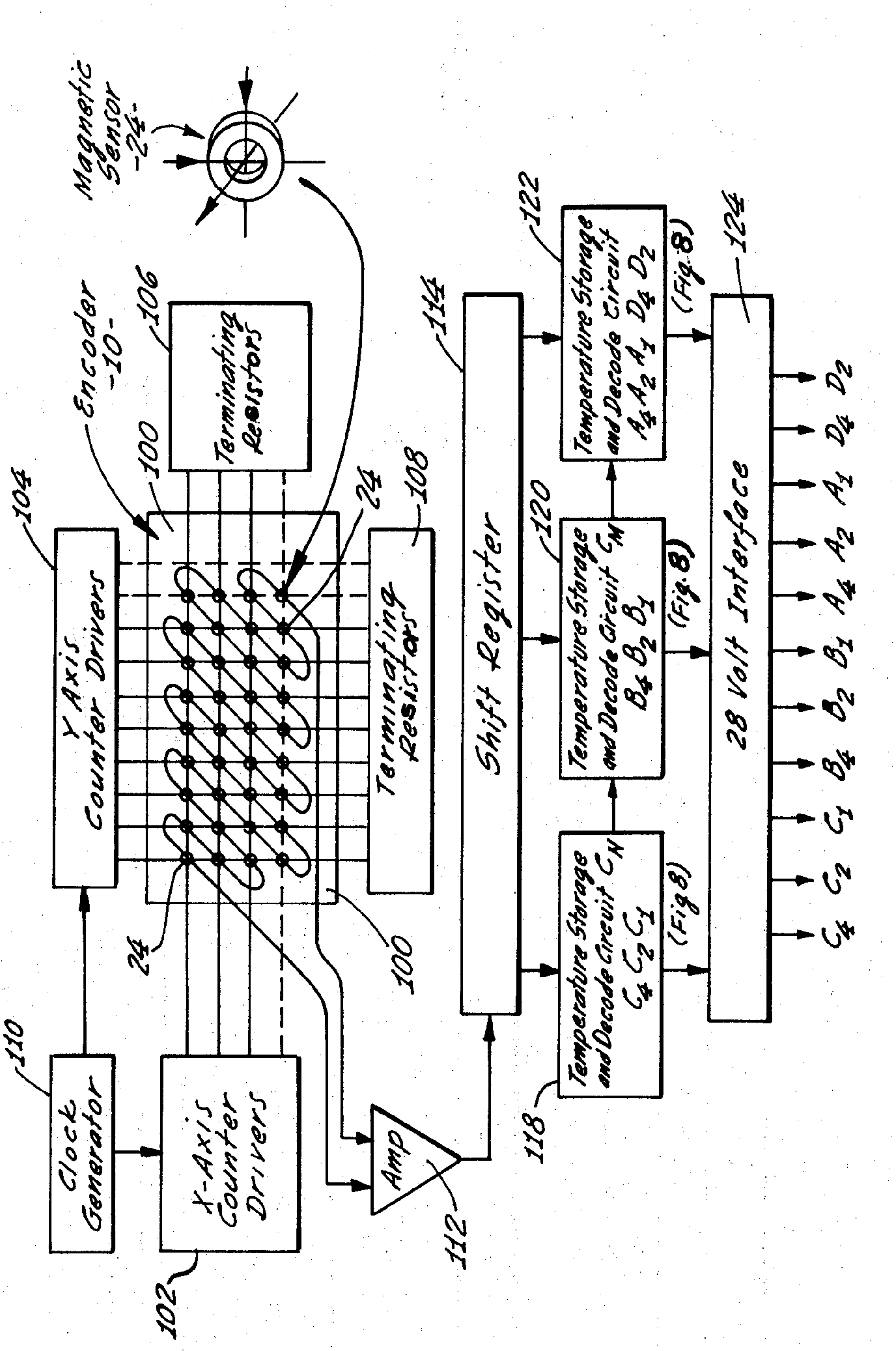
FIG. 7 is a block diagram of the magnetic encoder and associated circuitry in accordance with one embodiment of the invention.

The mechanical encoder unit of FIG. 1 is included in the overall encoder of the invention which is shown in block form in FIG. 7. In FIG. 7, the various sensors of the encoder, as described above, are included in an X-Y matrix designated 100 which is driven by a usual X-axis counter/driver 102 and Y-axis counter/drivers 104, the latter units operating in conjunction with terminating resistors represented respectively by the blocks 106 and 108. The drivers are driven by a clock generator 110 at a predetermined rate.

The sense windings of all the sensors 24 are connected in series and to an output amplifier 112. The amplifier 112 introduces its output serially into a shift register 114. The shift register produces binary bit representations $C_1$, $C_2$, $C_4$ and $C_n$ which are shifted in parallel into a temporary storage and decode circuit 118; the shift register also produces a binary bit representations $B_4$, $B_2$, $B_1$ and $C_m$ which are shifted in parallel into a temporary storage and decode circuit 120; and it produces binary bit representations $A_4$, $A_2$, $A_1$, $D_4$, $D_2$ which are shifted in parallel into a temporary storage and decode circuit 122. The outputs from the decode circuits 118, 120 and 122 are applied to a 28-volt interface circuit 124, so that the designated eleven output bits, properly inverted and scaled, may be used in a standard ICAO system.

As described above, the sensors 24 are wired for coincident current operation within the matrix 100. The clock generator 110 drives the X- and Y-axis counter/-drivers, with the X-axis counter being controlled to insure its operation at 1/10 of the rate of the Y-axis counter. The cores of the sensors 24 are reset by one of the Y-axis drivers. As also mentioned, the sense windings threaded through the cores of all the sensors are connected to the amplifier 112, to provide a differential input for the amplifier which provides a logic "1" and "0" levels. The operation of the counters of the X-axis counters/drivers and of the matrix 100 is known to the art, so that a further description of the operation is believed to be unnecessary for purposes of the present invention.

In the operation of the matrix 100, whenever an X-drive signal and a Y-drive signal coincide in a particular core of a sensor 24, that core is set to logic "1," and is subsequently reset after ten counts of the Y-axis counter. If the particular core is inhibited by the magnetized portion of the code pattern of its associated disc, the output is inhibited to provide a logic "0." The differential amplifier 112 is connected in an inverting mode, and shows anormal (unsaturated) core as logical "0" and an inhibited (saturated) core as logical "1. "

The amplified signals from the amplifier 112 are strobed into the shift register 114, which is an eight-bit serial-in parallel-out shift register, and depending on the particular order in the X-axis, the eight bits are steered to a temporary storage. The entire encoder is read out into the three separate storage and decode circuits 118, 120 and 122 for decoding purposes. The shift register 114 is updated every 100 microseconds so that the outputs will not change during the operation thereof. The complete ICAO code is obtained from the decode circuits 118, 120 and 122, and final inversion to interface to 28-volt circuits for outside connection is accomplished by inverters with open collector outputs in the interface circuit 124.

As stated above, the circuit details of the matrix 100 and its associated elements, are known to the art, so that a detailed circuit description herein is deemed to be unnecessary. Likewise, the circuit details of the amplifier 112, shift register 114, and interface circuit 124 are also known to the art.

Figure 8:
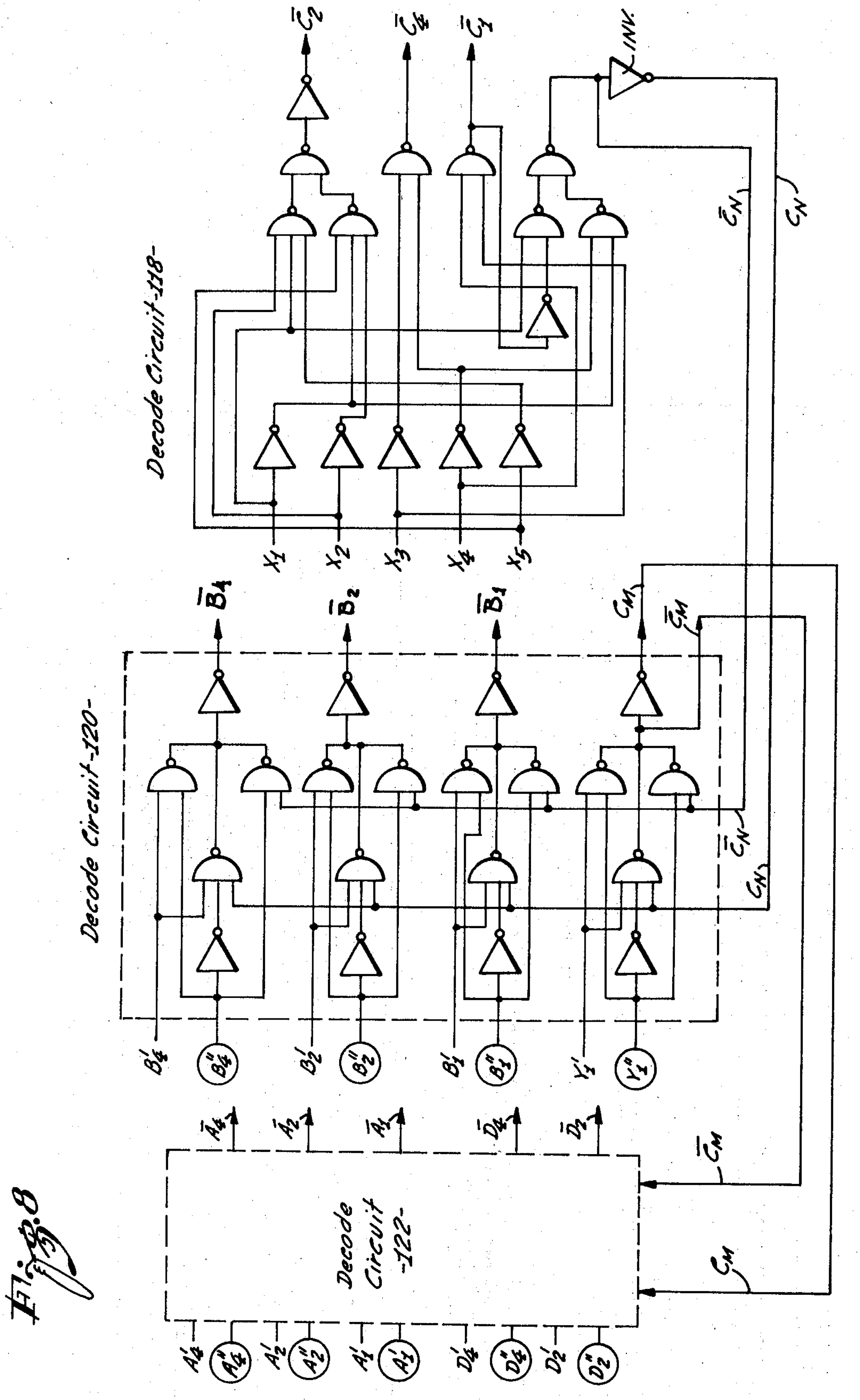
FIG. 8 is a logic diagram of certain decoders included in the block diagram of FIG. 7.

The decode circuits 118, 120 and 122 are logic circuits, and their logic components are shown in FIG. 8. The temporary storage and decode circuit 118, as shown in FIG. 8, incorporates standard logic circuit inverters and logic circuit gates, as shown, to transform the waveforms X1, X2, X3, X4 and X5 of FIG. 6 into the $\overline{C1}$, $\overline{C2}$ and $\overline{C4}$ ICAO code bits. The decode circuit 118 also generates a control bit $C_n$ which is used in the decode logic circuit 120. The decode circuit 120 transforms the bits $B'_4$, $B''_4$, $B'_2$, $B''_2$, $B'_1$, $B''_1$, Y' and Y," together with the control bits $C_n$ and $\overline{C}_n$ from the decode circuit 118, into the ICAO altitude bits $\overline{B}_4$, $\overline{B}_2$, $\overline{B}_1$, and the decode circuit 120 also generates a control bit $C_m$ for the decode circuit 122. The decode circuit 122 responds to the bits $A'_4$, $A''_4$, $A'_2$, $A''_2$, $A'_1$, $A''_1$, $D'_4$, $D''_4$, $D'_2$, $D''_2$, and to the control bits $C_m$ and $\overline{C}_m$ to produce the ICAO altitude bits $\overline{A}_1$, $\overline{A}_2$, $\overline{A}_4$, $\overline{D}_2$, $\overline{D}_4$.

Figure 9:
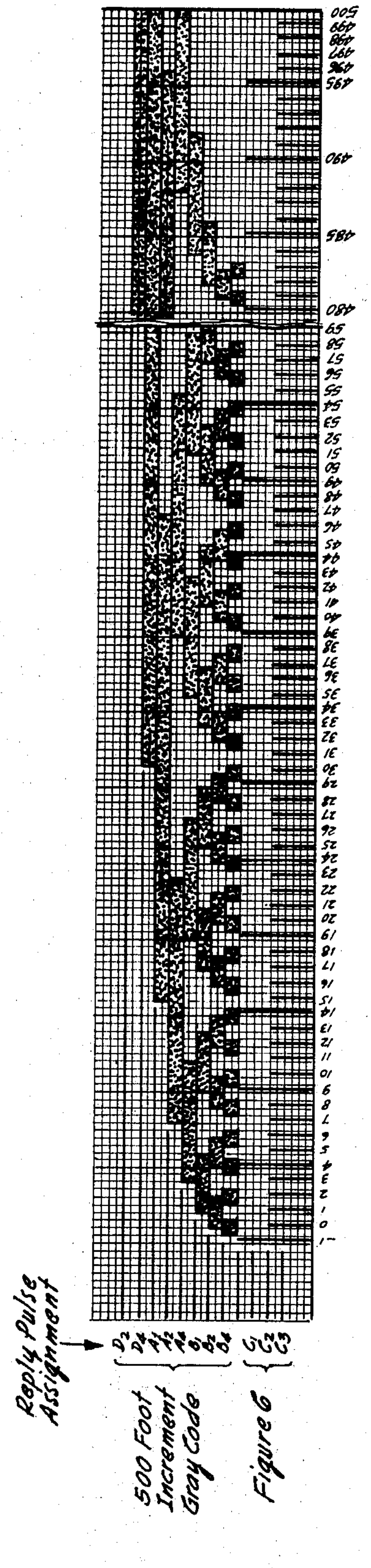
FIG. 9 is a diagrammatic representation of the ICAO code referred to above.

As mentioned above, the outputs from the decode circuits of FIG. 8 are inverted and scaled in the interface circuit 124 of FIG. 7 to provide the appropriate output bits for a standard ICAO altitude code. The waveforms of the outputs in accordance with the ICAO altitude code are shown in FIG. 9.

The invention provides, therefore, an improved, rugged and reliable shaft position-to-digital magnetic encoder that may be made physically small, and yet may have, for example, at least an eleven-bit binary output fro use as an ICAO coded altitude reporting encoder in aircraft transponding equipment. It is to be understood, of course, that the concept of the present invention resides in the provision of a magnetic encoder which is physically small in size, and yet which is capable of producing output bits in excess of its normal resolution. Specifically, the invention is not limited to the generation of bits in accordance with the ICAO altitude code, although the encoder of the invention finds particular utility in such an environment.

Therefore, while a particular embodiment of the invention has been shown and described, modifications may be made. It is intended in the following claims to cover the modifications which fall within the spirit and scope of the invention.

We claim:

1. A magnetic shaft rotation-to-digital encoder system comprising: an encoder unit including at least one rotatable disc having magnetically coded concentric tracks on at least one surface thereof; a plurality of sensors mounted in magnetically coupled relationship with respective ones of said tracks, each of said sensors including a magnetic core having a plurality of windings thereon including a first winding and a second winding and a sense winding; X-Y matrix means including first driver means connected to the first windings of said sensors and second driver means connected to the second windings of said sensors for selectively setting the cores of said sensors to a predetermined magnetic state unless inhibited by magnetized portions of the respective coded tracks of said disc; and output circuitry connected to the sense windings of the sensors for providing a multi-bit output corresponding to the angular position of the disc.

2. The magnetic shaft rotation-to-digital encoder system defined in claim 1, and which includes a second disc rotatably mounted in said encoder unit in coaxial relationship with said first-named disc and mechanically coupled to said first-named disc to be driven thereby at a fraction of the rotational speed of said first-named disc, said second disc also having magnetically coded concentric tracks on at least one surface thereof.

3. The magnetic shaft rotation-to-digital encoder system defined in claim 1, in which said output circuitry includes shift register means for receiving output signals from said sense windings as said sensors are successively selected in said X-Y matrix, and decoding circuitry coupled to said shift register and responding to the information therein for providing the aforesaid multi-bit outputs.

4. The magnetic shaft rotation-to-digital encoder system defined in claim 2, in which each of the two discs contains four concentric tracks magnetized in accordance with a predetermined binary code.

5. The magnetic shaft rotation-to-digital encoder system defined in claim 4, in which the sensors are positioned with respect to the tracks on the disc for a U-scan read-out.

6. The magnetic shaft rotation-to-digital encoder system defined in claim 1, in which each of said tracks is coded by magnetic segments of a particular arcuate length, and which includes five of the said sensors mounted to sense the magnetic segments in one of said tracks and spaced from one another to correspond effectively to one magnetic segment length.

7. The magnetic shaft rotation-to-digital encoder system defined in claim 2, in which said output circuitry includes decoding networks for producing multi-bit outputs corresponding to the standard ICAO altitude code.

* * * * *